United States Patent
Chen et al.

(10) Patent No.: US 11,942,730 B2
(45) Date of Patent: Mar. 26, 2024

(54) ACTIVE REDUNDANT Y-CABLE WITH POWER SHARING

(71) Applicant: CREDO TECHNOLOGY GROUP LTD, Grand Cayman (KY)

(72) Inventors: Baohua Chen, Xiamen (CN); Haoli Qian, Fremont, CA (US); Sheng Huang, San Jose, CA (US); Donald Barnetson, Fremont, CA (US)

(73) Assignee: Credo Technology Group Limited, Grand Cayman (KY)

( * ) Notice: Subject to any disclaimer, the term of this patent is extended or adjusted under 35 U.S.C. 154(b) by 455 days.

(21) Appl. No.: 17/305,798

(22) Filed: Jul. 14, 2021

(65) Prior Publication Data

US 2022/0385000 A1    Dec. 1, 2022

(30) Foreign Application Priority Data

May 31, 2021    (CN) .......................... 202110601769.9

(51) Int. Cl.
  *H01R 13/66*    (2006.01)
  *H01B 7/00*    (2006.01)
  (Continued)

(52) U.S. Cl.
  CPC ........... *H01R 13/665* (2013.01); *H01B 7/009* (2013.01); *H04L 49/405* (2013.01);
  (Continued)

(58) Field of Classification Search
  CPC ..... H01R 13/665; H01B 7/009; H04L 49/405; H05K 7/1492
  See application file for complete search history.

(56) References Cited

U.S. PATENT DOCUMENTS 7,547,991 B2   6/2009  Cisco
7,861,277 B2  12/2010  Redmere
(Continued)

OTHER PUBLICATIONS

Patoka M., Fundamentals of power system ORing, Mar. 21, 2007, Retrieved Jan. 8, 2024, from https://www.eetimes.com/fundamentals-of-power-system-oring/#.

(Continued)

*Primary Examiner* — Scott Bauer
(74) *Attorney, Agent, or Firm* — Ramey LLP; Daniel J. Krueger

(57) ABSTRACT

Active cables and communication methods can provide data path redundancy with power sharing. In one illustrative cable implementation, the cable includes a first connector with contacts to supply power to circuitry in the first connector; a second connector with contacts to supply power to a component of the circuitry in the first connector via a first connection that prevents reverse current flow; and a third connector with contacts to supply power to the same component via a second connection that prevents reverse current flow. An illustrative method implementation includes: using contacts of a first connector to supply power to circuitry in the first connector; and using contacts in each of multiple redundant connectors to supply power to a component of said circuitry in the first connector via a corresponding diodic or switched connection that prevents reverse current flow.

20 Claims, 6 Drawing Sheets

(51) Int. Cl.
*H04L 49/40* (2022.01)
*H05K 7/14* (2006.01)
*H02H 7/22* (2006.01)

(52) U.S. Cl.
CPC ....... *H05K 7/1492* (2013.01); *H01R 2201/04* (2013.01); *H02H 7/228* (2013.01)

(56) References Cited

U.S. PATENT DOCUMENTS

| | | |
|---|---|---|
| 7,873,980 B2 | 1/2011 | Redmere |
| 7,908,634 B2 | 3/2011 | Redmere |
| 8,006,277 B2 | 8/2011 | Redmere |
| 8,272,023 B2 | 9/2012 | Redmere |
| 8,479,248 B2 | 7/2013 | Horan et al. |
| 8,862,912 B2 | 10/2014 | Apple |
| 10,247,893 B1 * | 4/2019 | Elkayam .................. H02J 1/10 |
| 11,646,959 B2 | 5/2023 | Credo |
| 2009/0262790 A1 | 10/2009 | Alcatel |
| 2011/0135312 A1 * | 6/2011 | El-Ahmadi ........... H04L 1/0057 |
| | | 714/752 |
| 2014/0363171 A1 * | 12/2014 | Tang ..................... H01R 24/64 |
| | | 439/628 |
| 2018/0210524 A1 * | 7/2018 | Koenen .................. H04L 12/10 |
| 2019/0109486 A1 * | 4/2019 | Chiu ....................... H02J 9/061 |
| 2019/0294188 A1 | 9/2019 | Simmonds |

OTHER PUBLICATIONS

Basics of Ideal Diodes, Texas Instruments Incorporated, May 2019—Revised Feb. 2021.

* cited by examiner

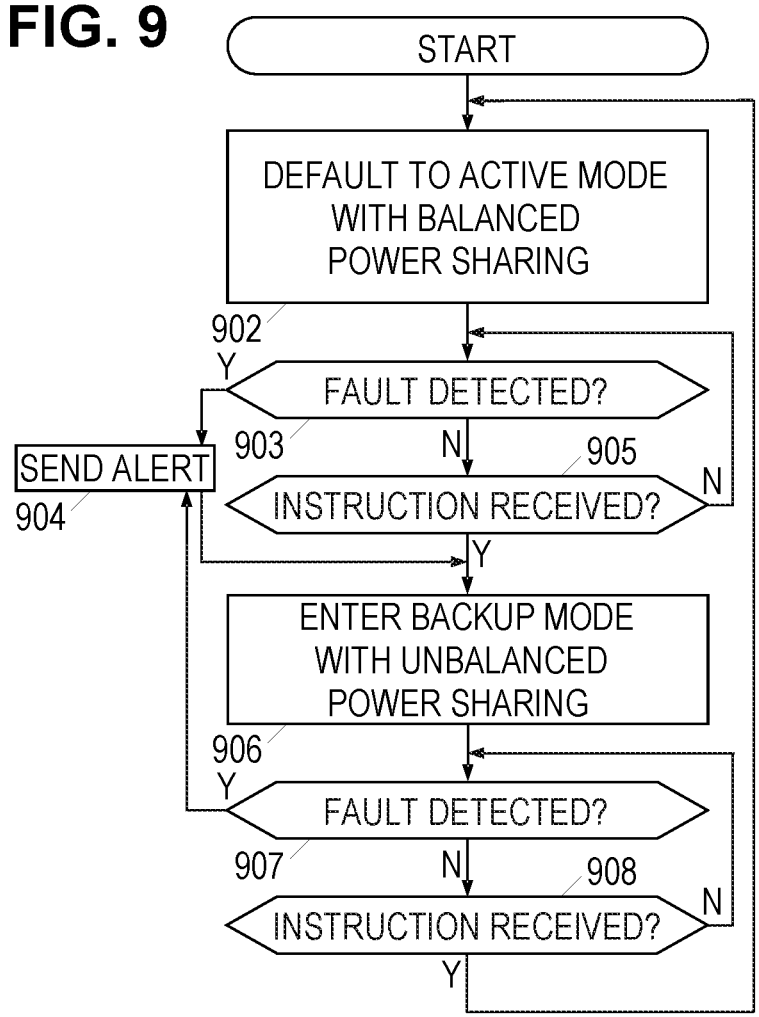

ACTIVE REDUNDANT Y-CABLE WITH POWER SHARING

TECHNICAL FIELD

The present disclosure relates to network cabling, and more specifically, to power sharing for active cables with redundant connectors.

BACKGROUND

Data centers for cloud computing must run customer applications without interruption. However, both hardware and software components inevitably fail at a rate characterized by their mean time to failure. As the data center infrastructure grows and becomes more complex the aggregated failure rate rises quickly. For hyperscale data centers the number of failures becomes difficult to handle.

One approach to this issue is to provide some form of redundancy that enables operations to continue even as failures are identified and repaired. When expressed in terms of hardware, the redundancy may take the form of an active component and an inactive, backup component that stands ready to take over if the active component should fail, thereby preventing a service interruption.

While such redundancies are beneficial, it would be inordinately expensive or inefficient to simply provide backups for every hardware component. Rather, it is desired to provide redundancy only where it is most beneficial to do so. For example, redundant Y-cables such as those disclosed by H. Qian et al. in U.S. application Ser. No. 16/932,988, titled "Active Ethernet Cable with Broadcasting and Multiplexing for Data Path Redundancy" and filed Jul. 20, 2020, enable redundant network switches to be introduced without necessitating duplication of servers or significant redesign of the network. As communication bandwidths increase, however, the power demands of the active cable circuitry may make it infeasible for the circuitry in each connector of the active cable to be powered solely by the port to which it is connected.

SUMMARY

Accordingly, there are disclosed herein active cables and communication methods that provide data path redundancy with power sharing. In one illustrative cable implementation, the cable includes a first connector with contacts to supply power to circuitry in the first connector; a second connector with contacts to supply power to a component of the circuitry in the first connector via a first connection that prevents reverse current flow; and a third connector with contacts to supply power to the same component via a second connection that prevents reverse current flow.

An illustrative method implementation includes: using contacts of a first connector to supply power to circuitry in the first connector; and using contacts in each of multiple redundant connectors to supply power to a component of said circuitry in the first connector via a corresponding diodic or switched connection that prevents reverse current flow.

An illustrative network implementation includes: a server having a network port; multiple switches each having switch ports; and a cable having a first connector coupled to the network port and multiple redundant connectors each coupled to a corresponding switch port, the cable configured to couple power from each of the multiple redundant connectors to a component in the first connector via respective connections that prevent reverse current flow.

Each of the foregoing implementations may be performed individually or conjointly and may be combined with any one or more of the following optional features: 1. the circuitry broadcasts in the first connector a data stream from an input of the first connector to the second and third or multiple redundant connectors. 2. the circuitry includes a multiplexer that couples a data stream from a selectable one of the second and third or multiple redundant connectors to an output of the first connector. 3. the component comprises a DC voltage converter. 4. the circuitry comprises multiple DC voltage converters, at least one of which receives power from the contacts of the first connector. 5. the connections each include at least one of: a diode, an ideal diode, and a transistor. 6. the connections each have equal resistance to balance a power demand between the second and third or multiple redundant connectors. 7. the circuitry provides data recovery and remodulation of a data stream entering the cable at the first connector and provides data recovery and remodulation of a data stream exiting the cable at the first connector.

BRIEF DESCRIPTION OF THE DRAWINGS

FIG. 9 is a flow diagram of an illustrative power sharing method.

DETAILED DESCRIPTION

Figure 1:
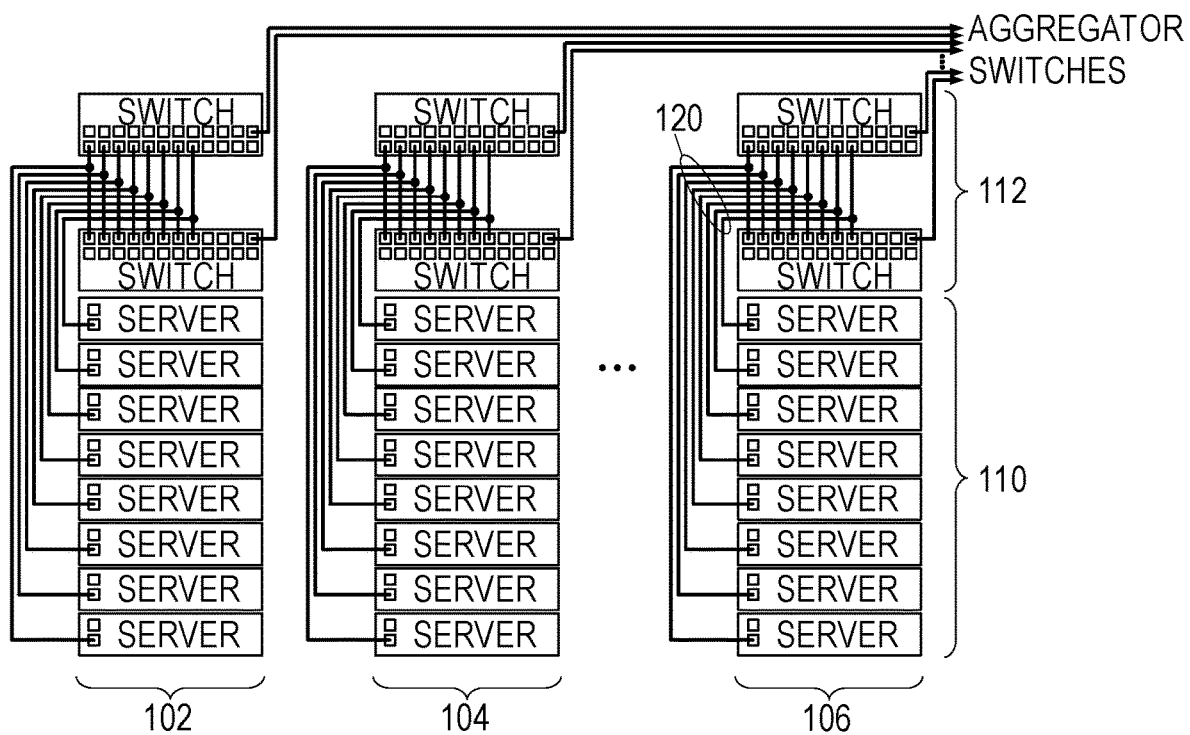
FIG. 1 shows a first illustrative network.

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

FIG. 1 shows an illustrative network such as might be found in a data processing center, with multiple server racks 102-106 each containing multiple servers 110 and a pair of switches 112. The switches 112 may be termed "top of rack" (TOR) switches, each of which are connected to aggregator switches for interconnectivity and connection to the regional network and internet. (As used herein, the term "switch" includes not just traditional network switches, but also routers and network bridges.) Each of the servers 110 is connected to the TOR switches 112 by redundant Y-cables 120, which preferably provide high speed differential communications compatible with the Ethernet standard.

Unlike a conventional breakout cable, redundant Y-cables 120 provide redundant connections to the switches 112, such that each cable connector can support the full data stream bandwidth. As described in further detail below, each cable couples the server network port to a selected one of the switch ports and, if a fault associated with the selected switch port is detected, the cable instead couples the network port to the other connected switch port, maintaining connectivity even in the presence of such faults and providing an opportunity for the fault to be corrected without disrupting communication between the server and the network. In the event of a TOR switch failure, the cables 120 can automatically redirect the data stream traffic to the other TOR switch. Alternatively, a network configuration manager can configure the cables to direct traffic as desired, e.g., in preparation for maintenance or replacement of a TOR switch.

Figure 2:
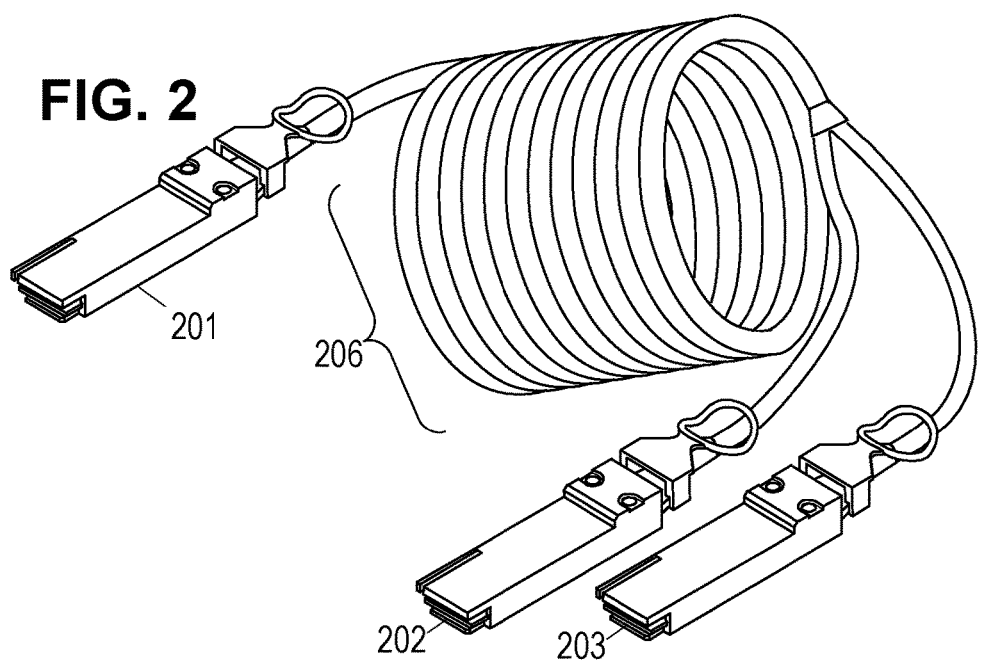
FIG. 2 is an isometric view of an illustrative redundant Y-cable.

FIG. 2 is an isometric view of an illustrative redundant Y-cable having a first, non-redundant connector 201 connected to a second and third redundant connectors 202, 203 by a cord 206 containing electrical conductors. Each of the connectors has electrical contacts that couple to matching contacts in a network port of a server, switch, or other network node. Electronic circuitry may be packaged within each of the connectors as indicated in FIG. 3.

Figure 3:
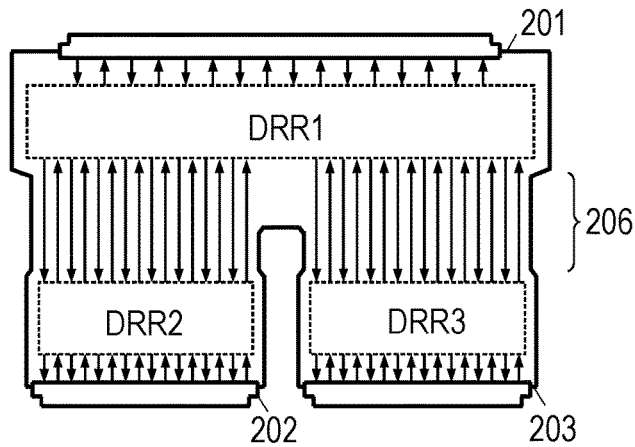
FIG. 3 is a block diagram of an illustrative redundant Y-cable.

In the illustrated cable of FIG. 3, each of the first, second, and third connectors 201, 202, 203 includes a data recovery and remodulation (DRR) device. DRR1 couples eight bidirectional data lanes from connector 201 to sixteen bidirectional data lanes as discussed below. DRR2 and DRR3 are optional, but if included they each couple eight of the sixteen bidirectional data lanes to respective data lanes of connectors 202, 203. Though the illustrated example presumes the full data stream bandwidth is carried by eight bidirectional lanes, the bandwidth and associated number of data lanes of the cable design can vary.

The DRR devices may be implemented as integrated circuit devices that each mount with optional supporting components to a small printed circuit board (aka "paddle card") in the respective connector. The printed circuit board electrically couples the DRR device contacts to the cable conductors and to the contacts of the network port connectors.

Figure 4:
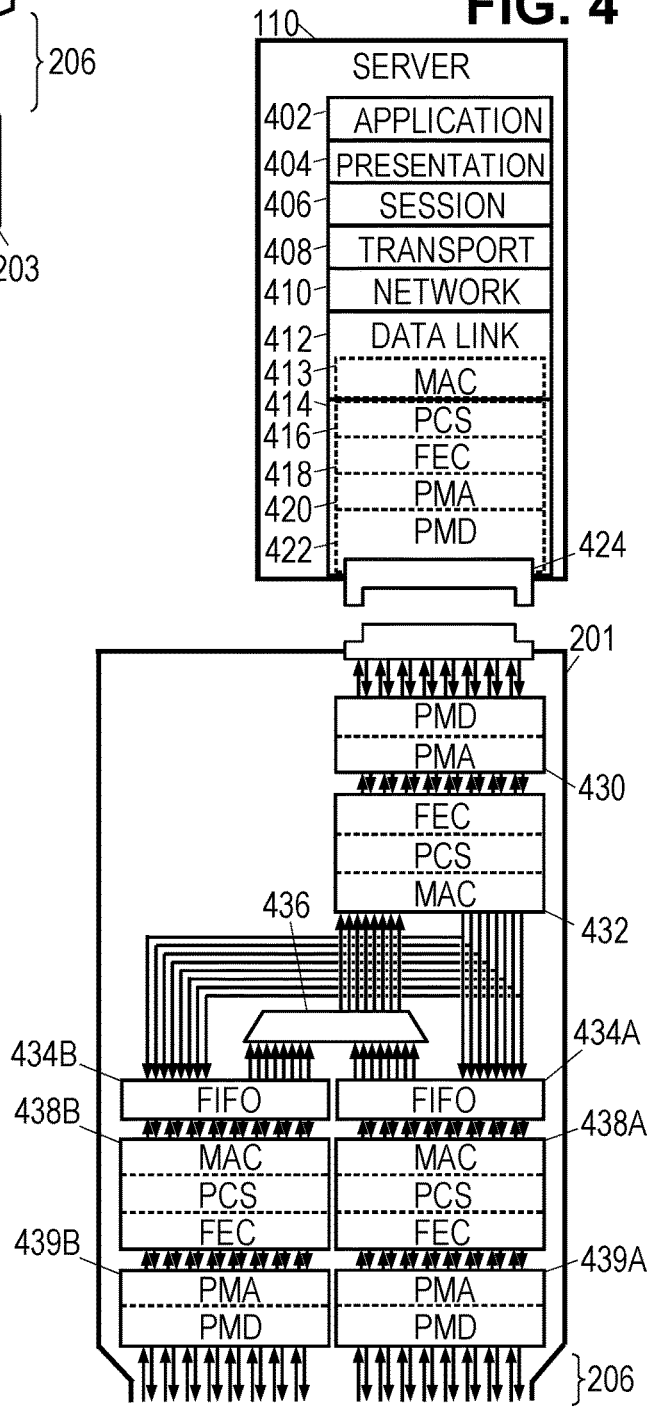
FIG. 4 is a model diagram of an illustrative cable connector and server node.

The DRR device operation may be understood with reference to FIG. 4, though we note here that further details are available in co-owned U.S. application Ser. No. 16/932, 988 filed 2020 Jul. 20 and titled "Active Ethernet Cable with Broadcasting and Multiplexing for Data Path Redundancy", which is hereby incorporated by reference herein in its entirety. FIG. 4 uses the ISO/IEC Model for Open Systems Interconnection (See ISO/IEC 7498-1:1994.1) to represent part of a communication link architecture for communications over a physical medium such as the electrical conductors within cord 206. The interconnection reference model employs a hierarchy of layers with defined functions and interfaces to facilitate the design and implementation of compatible systems by different teams or vendors. While it is not a requirement, it is expected that the higher layers in the hierarchy will be implemented primarily by software or firmware operating on programmable processors while the lower layers will be implemented as application-specific hardware.

The Application Layer 402 is the uppermost layer in the model, and it represents the user applications or other software operating a server or other system that needs a facility for communicating messages or data. The Presentation Layer 404 provides such applications with a set of application programming interfaces (APIs) that provide formal syntax along with services for data transformations (e.g., compression), establishing communication sessions, selecting a connectionless communication mode, and performing negotiation to enable the application software to identify the available service options and select therefrom. The Session Layer 406 provides services for coordinating data exchange including: session synchronization, token management, full- or half-duplex mode implementation, and establishing, managing, and releasing a session connection. In the connectionless mode, the Session Layer may merely map between session addresses and transport addresses.

The Transport Layer 408 provides services for multiplexing, end-to-end sequence control, error detection, segmenting, blocking, concatenation, flow control on individual connections (including suspend/resume) and implementing end-to-end service quality specifications. The focus of the Transport Layer 408 is end-to-end performance/behavior. The Network Layer 410 provides a routing service, determining the links used to make the end-to-end connection and when necessary acting as a relay service to couple together such links. The Data link layer 412 serves as the interface to physical connections, providing delimiting, synchronization, sequence and flow control across the physical connection. It may also perform packet integrity verification to detect and optionally correct packet errors that occur across the physical connection. The Physical layer 414 provides the mechanical, electrical, functional, and procedural means to activate, maintain, and deactivate communication channels, and to use those channels for transmission of bits across the physical media.

The Data Link Layer 412 and Physical Layer 414 are subdivided and modified slightly by IEEE Std 802.3-2015, which provides a Media Access Control (MAC) Sublayer 413 in the Data Link Layer 412 to define the interface with the Physical Layer 414, including a frame structure and transfer syntax. Within the Physical Layer 414, the standard provides a variety of possible subdivisions such as the one illustrated, which includes a Physical Coding Sublayer (PCS) 416, a Forward Error Correction (FEC) Sublayer 418, a Physical Media Attachment (PMA) Sublayer 420, and a Physical Medium Dependent (PMD) Sublayer 422.

The PCS Sublayer 416 provides scrambling/descrambling, data encoding/decoding (with a transmission code that enables clock recovery and bit error detection), block and symbol redistribution, PCS alignment marker insertion/removal, and block-level lane synchronization and deskew. To enable bit error rate estimation by components of the Physical Layer 414, the PCS alignment markers typically include Bit-Interleaved-Parity (BIP) values derived from the preceding bits in the lane up to and including the preceding PCS alignment marker.

The FEC Sublayer 418 provides, e.g., Reed-Solomon coding/decoding that distributes data blocks with controlled redundancy across the lanes to enable error correction. In some embodiments (e.g., in accordance with Article 91 or proposed Article 134 for the IEEE Std 802.3), the FEC Sublayer 418 modifies the number of data lanes.

The PMA Sublayer 420 provides lane remapping, symbol encoding/decoding, framing, and octet/symbol synchronization. In some embodiments, the PMA Sublayer 420 co-opts portions of the PCS alignment markers to implement a hidden backchannel as described in co-owned U.S. Pat. No. 10,212,260 "SerDes architecture with a hidden backchannel protocol". The backchannel can be used for training information as well as to convey command and status info among the DRR devices in the cable connectors.

The PMD Sublayer 422 specifies the transceiver conversions between transmitted/received channel signals and the corresponding bit (or digital symbol) streams. Typically, the PMD Sublayer 422 implements a channel training phase and optionally an auto-negotiation phase before entering a normal operating phase. The auto-negotiation phase enables the end nodes to exchange information about their capabilities, and the training phase enables the end nodes to each adapt transmit-side and receive-side equalization filters in a fashion that combats the channel non-idealities. A port connector receptacle 424 is also shown as part of the PMD sublayer 422 to represent the physical network interface port.

Various contemplated embodiments of the DRR devices implement the functionality of the PMD, PMA, and FEC Sublayers. See, e.g., co-owned U.S. application Ser. No. 16/793,746 "Parallel Channel Skew for Enhanced Error Correction", filed 2020 Feb. 18 and hereby incorporated herein by reference. More information regarding the operation of the sublayers, as well as the electrical and physical specifications of the connections to the communications medium (e.g., pin layouts, line impedances, signal voltages & timing), and the electrical and physical specifications for the communications medium itself (e.g., conductor arrangements in copper cable, limitations on attenuation, propagation delay, signal skew), can in many cases be found in the current Ethernet standard.

FIG. 4 further shows an illustrative non-redundant connector 201 having a plug that mates with network port receptacle 424. Non-redundant connector 201 includes a DRR device with a set of SerDes modules to implement the host facing PMD and PMA sublayers 430, and sets of SerDes modules implementing the PMD, PMA sublayers 439A, 439B for communicating with redundant connectors 202, 203 via conductors in cord 206 (FIGS. 2-3). Optionally, the DRR device may further implement host-facing FEC, PCS, and MAC sublayers 432, as well as cable-facing FEC, PCS, and MAC sublayers 438A, 438B for respectively communicating with redundant connectors 202, 203. A set of first-in first-out (FIFO) buffers 434A buffer the bidirectional multi-lane data streams between the host-facing sublayers 430-432 and the sublayers 438A-439A for communicating with the first redundant connector 202. A second set of FIFO buffers does the same between the host-facing sublayers 430-432 and sublayers 438B-439B for communicating with the second redundant connector 203.

The multi-lane data stream received by the host-facing sublayers 430-432 from the server 110 is (after error correction and packet integrity checking by optional sublayers 432) broadcast to both FIFO buffer sets 434A, 434B for communication to both of the redundant connectors 202, 203. The buffered multi-lane data streams from each of the redundant connectors are provided from both FIFO buffer sets 434A, 434B to a multiplexer 436, which selects one of the two multi-lane data streams for communication to the host-facing PMD, PMA sublayers 430 (after packet checksum generation and error correction coding by optional sublayers 432).

Though communications from both FIFO buffer sets are provided to the multiplexer and communications to both FIFO buffer sets are provided from the host-facing sublayers, the multiplexer state enables only one complete communications link; if the multiplexer selects the multi-lane data stream from FIFO buffer set 434A, the communications link between connectors 201 and 202 is enabled. Otherwise, when FIFO buffer set 434B is selected, the communications link between connectors 201 and 203 is enabled.

Multiple implementations of the illustrated broadcast/multiplex approach are possible for introducing redundancy into the cable design, as described in co-owned U.S. application Ser. No. 16/932,988 filed 2020 Jul. 20 and titled "Active Ethernet Cable with Broadcasting and Multiplexing for Data Path Redundancy". Note that in any case, redundant connectors 202, 203 (and thus circuitry DRR2, DRR3) need not perform broadcast and multiplexing functions, and hence need not duplicate cable facing sublayers 438, 439. Accordingly, the power requirements of the circuitry DRR2, DRR3 in redundant connectors 202, 203 will be lower than that of the circuitry DRR1 in non-redundant connector 201.

Figure 5:
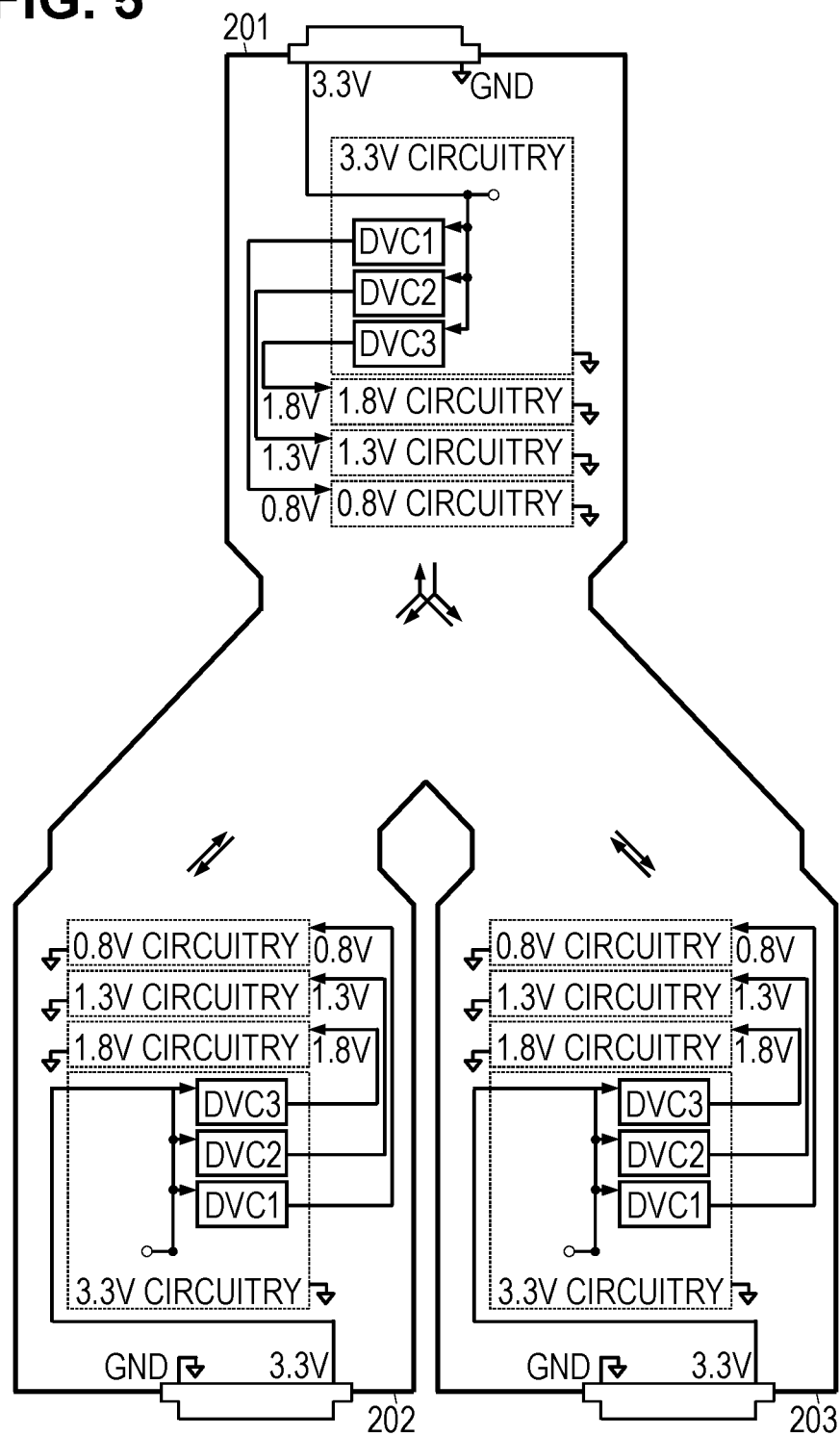
FIG. 5 is a schematic of power domains in a first illustrative active redundant Y-cable.

FIG. 5 is a schematic of power domains in a first illustrative active redundant Y-cable that does not employ power sharing; i.e., each connector's circuitry is powered solely by the port to which it is connected. For example, connector 201 is shown having circuitry divided into different voltage domains, a 3.3V voltage domain, a 1.8V voltage domain, a 1.3V voltage domain, and a 0.8V voltage domain. It is expected, though not required, that the different voltage domains correspond to integrated circuit devices manufactured with different process technologies. These voltage domains are illustrative and should be expected to change for different implementations of the circuitry, using more or fewer domains with possibly different supply voltages that need not all be distinct from each other.

The 3.3V voltage domain is shown including, potentially in addition to other circuit components, three DC voltage converters DVC1, DVC2, DVC3, each of which converts the 3.3V from the connector into a supply voltage for one of the other voltage domains. Converter DVC1 steps the 3.3V supply voltage to a 0.8V supply voltage; converter DVC2 steps the 3.3V supply voltage to a 1.3V supply voltage; and DVC3 steps the 3.3V supply voltage down to a 1.8V supply voltage. The various voltage domains (and each of the connectors) share a common ground connection.

The plug of connector 201 includes electrical contacts for receiving power from matching contacts of the network port connector receptacle. At least one of the receptacle contacts provides a 3.3V supply voltage relative to the one or more ground contacts of the receptacle. However, most network and switch port manufacturers limit the current draw from their network ports to around 1 to 1.5 amps, corresponding to a power limit of between roughly 3.5 and 5 watts. In one illustrative implementation, the power requirements of DRR2, DRR3 may be approximately 2.5 W, and the power requirements of DRR1 may be, say, 4.5 W. In the absence of power sharing, the non-redundant connector 201 could only be used with those network ports that support higher power draws.

Figure 6:
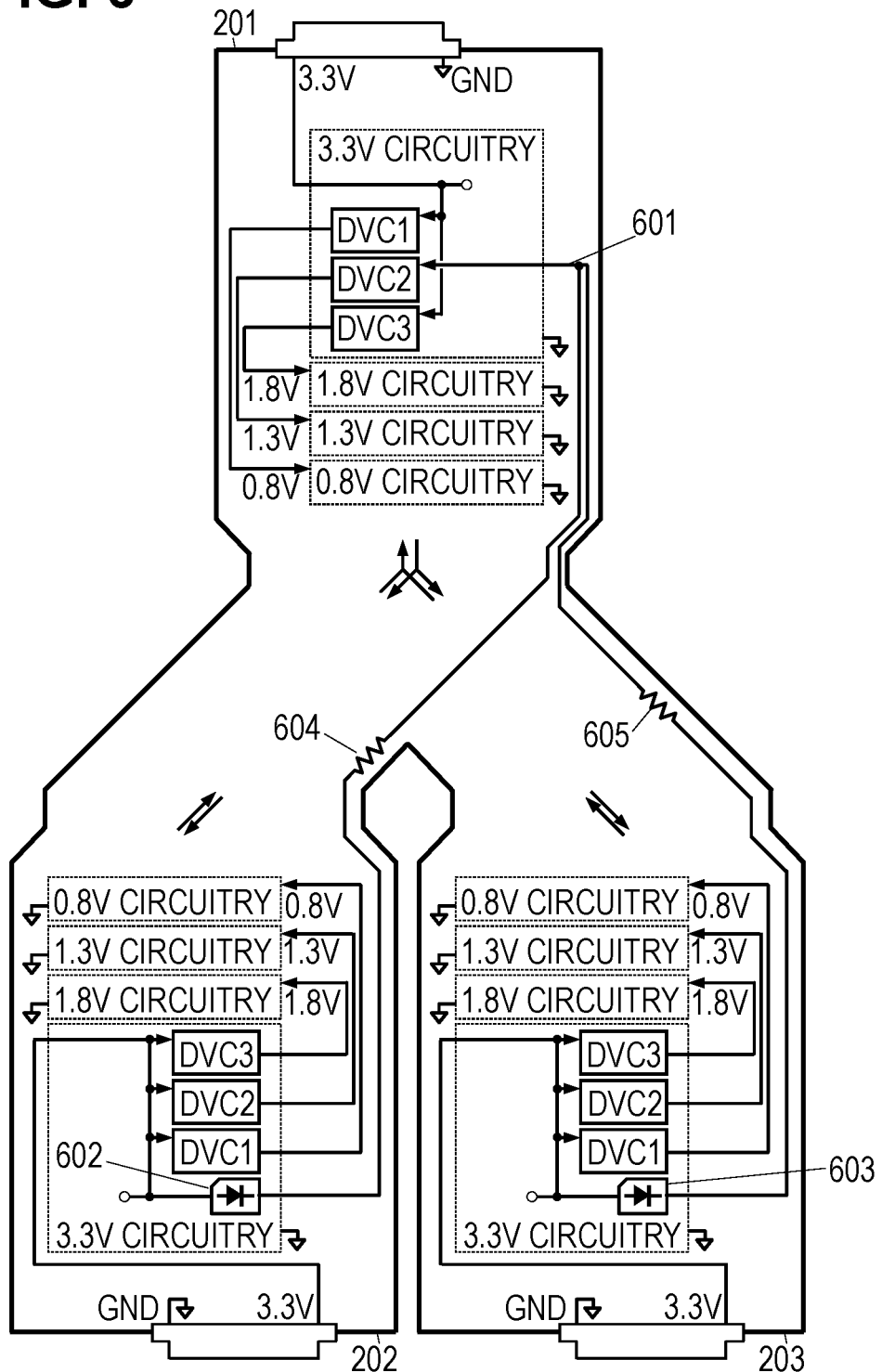
FIG. 6 is a schematic showing power sharing in a second illustrative active redundant Y-cable.

FIG. 6 is a schematic showing a second illustrative active redundant Y-cable having power sharing. Each of the redundant connectors 202, 203 includes a diodic component 602, 603 in a connection path that couples a supply voltage to a voltage node 601 in the non-redundant connector. The diodic components 602, 603, may be diodes, transistors, or other components that prevent reverse current flow, thereby enabling continued operation of the other connectors if one of the switch ports for connectors 202, 203 loses power. In FIG. 6, the diodic components are shown as ideal diodes, which are integrated circuit devices designed to permit forward current flow with a minimal voltage drop while efficiently preventing reverse current flow. Such devices are commercially available as discrete devices from, e.g., Texas Instruments as LM66100 or as LM74700-Q1 (the latter being an ideal diode controller for a discrete MOSFET). However, the function of such devices could also be subsumed into a integrated circuit device providing other functions such as a controller.

The diodic connection paths further include resistances 604, 605, which may represent the resistance of the electrical conductors in cord 206 or may represent discrete resistors. Resistances 604, 605 are approximately equal to provide inexpensive current balancing when both redundant connectors are supplying power. The resistances will depend on various design considerations, but are expected to be in the range of 0.05 to 0.5 ohms.

At least one component of the circuitry in connector 201 draws power from voltage node 601. In FIG. 6, that component is one of the DC voltage converters (DVC2) which, rather than drawing power from plug contacts of connector 201, instead draws power from voltage node 601, which is powered so long as at least one of the redundant connectors is powered. Allocating each voltage domain to one of the available power sources (either voltage node 601 or the plug contact(s) of connector 201) is an efficient way to draw power from multiple power sources, as it minimizes complexity and cost in terms of additional circuit components. The optimal allocation depends on the power requirements of each domain.

The voltage supplied by the redundant connectors is shown being provided from their 3.3V voltage domains, as supplying it from one of the lower voltage domains would necessitate more current and would increase power dissipation. However, there may be countervailing considerations (perhaps layout limitations or reduced complexity achieved by eliminating one of the voltage converters in the non-redundant connector 201) that would make it desirable to supply the voltage from one of the lower voltage domains. Conversely, the redundant connectors may employ step-up voltage converters to raise the supplied voltage and further reduce current and associated power dissipation in the conductors. The DC voltage converter receiving power from voltage node 601 would correspondingly step the voltage down from the chosen supply voltage.

With power sharing in the previous example (DRR2, DRR3 power requirements of 2.5 W, DRR1 power requirements of 4.5 W), the total power draw from each network port can be limited to no more than 3.5 W. Non-redundant connector 201 could draw 3.5 W locally and draw 1 W remotely, with the remote demand being split between the redundant connectors.

Figure 7:
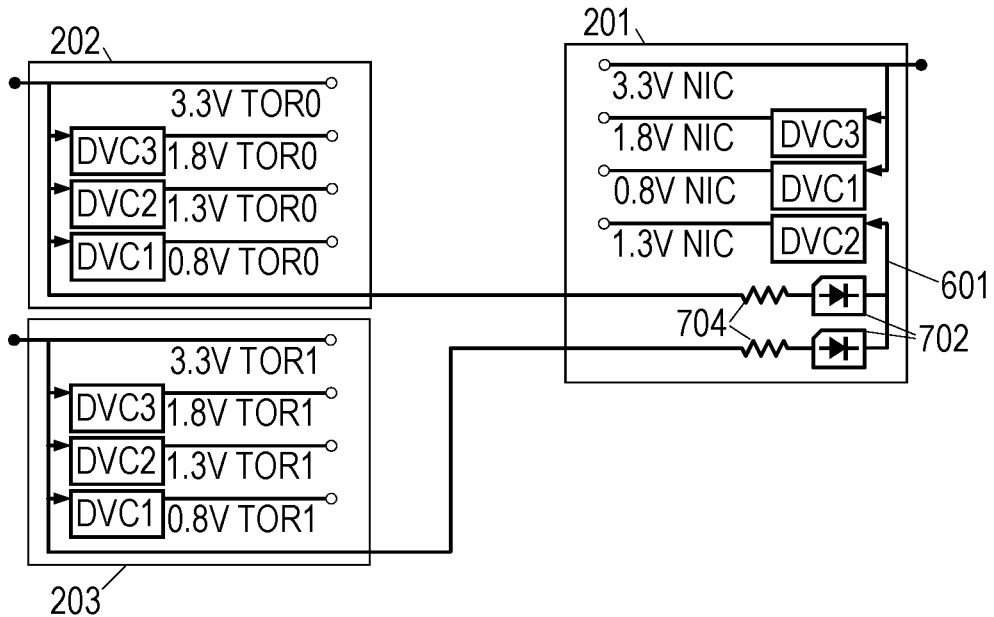
FIG. 7 is a schematic showing a first alternative diodic connection configuration.

FIG. 7 is a schematic showing a first alternative diodic connection configuration. In the configuration of FIG. 7, the diodic components 702 are located in non-redundant connector 201 rather than in the redundant connectors, and each diodic connection path includes a discrete resistor 704 to provide current balancing.

Figure 8:
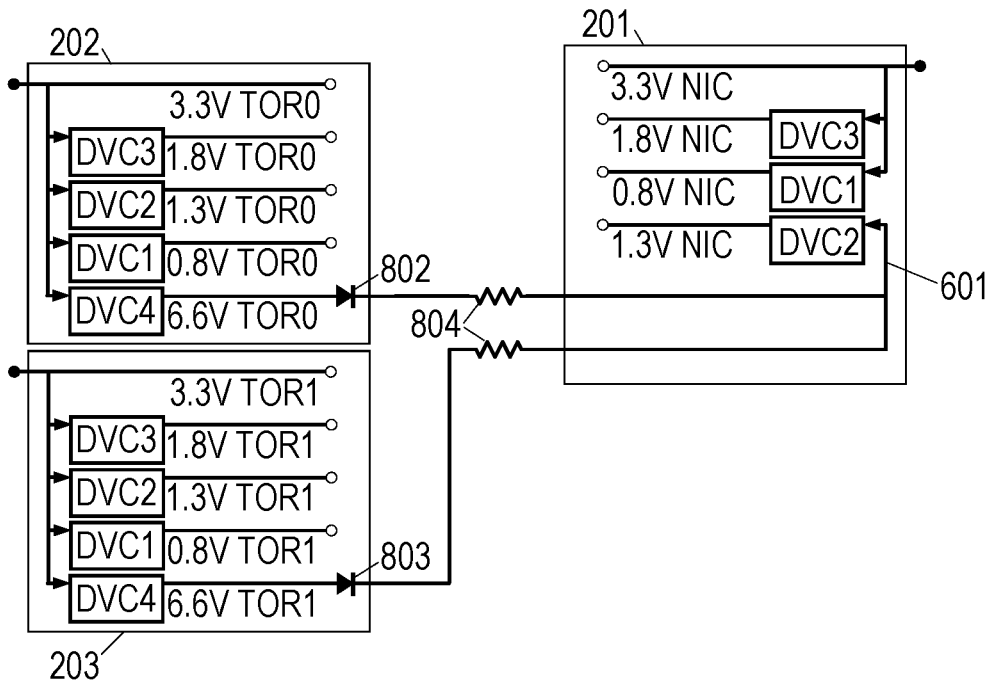
FIG. 8 is a schematic showing a second alternative diodic connection configuration.

FIG. 8 is a schematic showing a second alternative diodic connection configuration. In the configuration of FIG. 8, the redundant connectors 202, 203 each include a step-up DC voltage converter DC4 that doubles the supply voltage to 6.6V. The diodic components are shown as diodes 802, 803 which may be discrete components but are more preferably part of an integrated circuit device in connectors 202, 203. With the stepped up voltage, the higher voltage drop for current flow may be better tolerated thus enabling a less expensive diodic component implementation to be used. Current-balancing resistances 804 represent resistance of the electrical conductors which are sized to provide the desired resistance.

We note here that when the primary communications link between connectors 201, 202 is active (selected), it is possible for the secondary communications link between connectors 201, 203 to experience multiple outages without affecting the traffic on the primary link. In the event of any power failure at connector 203, connector 202 continues to supply power to voltage node 601 to power components of connector 201. The diodic connections prevent reverse current flow from node 601 to connector 203.

If, due to a hardware or software failure, the primary link goes down, the data stream received via the non-redundant connector 201 is still broadcast to the redundant connector 203, and any data received via connector 203 is conveyed to the multiplexer, which can select that data for transmission via connector 201. The DRR device or an external controller can detect the link failure and change the state of the multiplexer. The transition between states is fast, i.e., on the order of a few nanoseconds. The secondary communications link status remains stable during the transition, supplying power from connector 203 to node 601. The diodic connection between connectors 201 and 202 prevents any reverse current flow from node 601 to connector 202 in the event connector 202 loses power.

Although the link status can generally tolerate a truncated packet or two such as might be caused by an unsynchronized transition of the multiplexer, the DRR device can readily arrange for a synchronized transition. The physical layer interface may monitor the packet header information, enabling a transition to begin after the end of a packet from the primary communications link, and to complete when a packet from the secondary communications link begins. An idle pattern may be used to maintain the link during the transition interval.

The transition may be associated with an error code or alert signal in the DRR devices internal registers, causing the DRR device to convey an alert message to a network management service, which can in turn alert appropriate service personnel. Because the secondary communications link is operable, the cable connection continues to function while service personnel have time to diagnose and address the cause of the primary communications link failure.

When the primary communications link becomes operable, that condition may be detected by the cable-facing module 438A, and the DRR device can return the multiplexer to its original state to resume using the primary communications link. As before, the state transition is fast, on the order of a few nanoseconds. The shared supply of power to voltage node 601 is restored automatically via the diodic connections.

FIG. 9 is a flow diagram of an illustrative power sharing method which may be implemented by the foregoing cable design. In block 902, the cable defaults to an active state in which non-redundant connector 201 receives power from its host as well as power via voltage node 601, which in turn is supplied via diodic connections from redundant connectors 202, 203. The DRR1 circuitry of connector 201 receives data via the non-redundant connector plug and copies that data to both redundant connectors 202, 203. The DRR1 circuitry provides data from redundant connector 202 via the non-redundant connector plug to the host port.

In block 903, the DRR1 circuitry checks for a fault, and if one is detected, the DRR1 circuitry optionally sends an alert in block 904 to initiate correction of the fault, and transitions to block 906. Otherwise, the DRR1 circuitry determines whether an instruction has been received to change the operating mode. If not, blocks 903 and 905 are repeated until a fault is detected or a mode change instruction is received, at which point, the DRR device transitions to block 906.

In block 906, the DRR1 circuitry transitions to an unbalanced supply state, with voltage node 601 being supplied from whichever of the redundant connectors is still powered. The data received via the non-redundant connector 201 is copied to both the redundant connectors 202, 203, and the data transmitted from the non-redundant connector 201 is received via the secondary redundant connector 203 (or, in case of a fault in the secondary communications path, from redundant connector 202).

In block 907, the DRR device checks for a fault in the current communications path, and if one is detected, the DRR device optionally sends an alert in block 904 before transitioning back to block 906 and switching to the alternative communications path. Otherwise, the DRR device determines whether a mode change instruction has been received in block 908. If so, the DRR1 circuitry transitions back to block 902. Otherwise, blocks 907 and 908 are repeated until a mode change instruction is received or a fault is detected.

The state transitions are expected to be fast, preserving the stability of each data path.

The foregoing embodiments are expected to facilitate practical and economic realization of path redundancies. Numerous alternative forms, equivalents, and modifications will become apparent to those skilled in the art once the above disclosure is fully appreciated. For example, the embodiments described above provide redundancy in the form of a single secondary redundant connector, but those of ordinary skill would recognize that the disclosed principles can be readily extended to provide multiple secondary redundant connectors to further increase the redundancy. It is intended that the claims be interpreted to embrace all such alternative forms, equivalents, and modifications that are encompassed in the scope of the appended claims.

What is claimed is:

1. A cable that comprises:
a first connector with contacts to supply power from a first network port to circuitry in the first connector;
a second connector with contacts to supply power from a second network port to a component of said circuitry in the first connector via a first connection that prevents reverse current flow; and
a third connector with contacts to supply power from a third network port to the component of said circuitry in the first connector via a second connection that prevents reverse current flow.

2. The cable of claim 1, wherein the circuitry in the first connector broadcasts a data stream from an input of the first connector to the second and third connectors, and wherein the circuitry includes a multiplexer that couples a data stream from a selectable one of the second and third connectors to an output of the first connector.

3. The cable of claim 1, wherein the component comprises a DC voltage converter.

4. The cable of claim 3, wherein the circuitry comprises multiple DC voltage converters, at least one of which receives power from the contacts of the first connector.

5. The cable of claim 1, wherein the first and second connections each comprise at least one of: a diode, an ideal diode, and a transistor.

6. The cable of claim 5, wherein the first and second connections have equal resistance to balance a power demand between the second and third connectors.

7. The cable of claim 1, wherein the circuitry provides data recovery and remodulation of a data stream entering the cable at the first connector and provides data recovery and remodulation of a data stream exiting the cable at the first connector.

8. A method comprising:
using contacts of a first connector to supply power from a first network port to circuitry in the first connector; and
using contacts in each of multiple redundant connectors to supply power from a corresponding network port to a component of said circuitry in the first connector via a corresponding connection that prevents reverse current flow.

9. The method of claim 8, wherein the circuitry in the first connector broadcasts a data stream from an input of the first connector to the multiple redundant connectors, and wherein the circuitry includes a multiplexer that couples a data stream from a selectable one of the multiple redundant connectors to an output of the first connector.

10. The method of claim 8, wherein the component comprises a DC voltage converter.

11. The method of claim 10, wherein the circuitry comprises multiple DC voltage converters, at least one of which receives power from the contacts of the first connector.

12. The method of claim 8, wherein each of the corresponding connections comprises a diode, an ideal diode, or a transistor.

13. The method of claim 12, wherein each of the corresponding connections have equal resistance to balance a power demand between the multiple redundant connectors.

14. The method of claim 8, wherein the circuitry provides data recovery and remodulation of a data stream entering the cable at the first connector and provides data recovery and remodulation of a data stream exiting the cable at the first connector.

15. A network that comprises:
a server having a network port;
multiple switches each having switch ports; and
a cable having: a first connector coupled to the network port to receive power for circuitry in the first connector, and multiple redundant connectors each coupled to a corresponding switch port, the cable configured to couple power from each of the multiple redundant connectors to a component of the circuitry in the first connector via respective connections that prevent reverse current flow.

16. The network of claim 15, wherein the circuitry in the first connector broadcasts a data stream from an input of the first connector to the multiple redundant connectors.

17. The network of claim 15, wherein the component comprises a DC voltage converter.

18. The network of claim 17, wherein the circuitry comprises multiple DC voltage converters, at least one of which receives power from the network port.

19. The network of claim 15, wherein each of the corresponding connections comprises a diode, an ideal diode, or a transistor.

20. The network of claim 19, wherein each of the corresponding connections have equal resistance to balance a power demand between the multiple redundant connectors.

* * * * *